(12) United States Patent
Lin et al.

(10) Patent No.: US 8,513,533 B2
(45) Date of Patent: Aug. 20, 2013

(54) MULTILAYER STACKED CIRCUIT ARRANGEMENT WITH LOCALIZED SEPARATION SECTION

(75) Inventors: Gwun-Jin Lin, Taoyuan County (TW); Kuo-Fu Su, Taoyuan County (TW); Chih-Heng Chuo, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 85 days.

(21) Appl. No.: 13/225,623

(22) Filed: Sep. 6, 2011

(65) Prior Publication Data
US 2012/0267156 A1  Oct. 25, 2012

(30) Foreign Application Priority Data

Apr. 20, 2011  (TW) .............................. 100113698 A

(51) Int. Cl.
*H05K 1/00*  (2006.01)

(52) U.S. Cl.
USPC ........ 174/254; 174/259; 174/262; 174/117 F; 174/117 FF; 361/736; 361/749; 361/792

(58) Field of Classification Search
USPC .......... 174/68.1, 72 A, 72 TR, 117 F, 117 FF, 174/250, 254, 255, 257, 259, 261, 262; 361/735, 736, 748, 749, 790, 792, 804
See application file for complete search history.

(56) References Cited

U.S. PATENT DOCUMENTS

| 4,463,323 A * | 7/1984 | Piper ................................ 333/1 |
| 4,687,695 A * | 8/1987 | Hamby ........................ 428/192 |

FOREIGN PATENT DOCUMENTS

WO  WO 2011/018862  *  2/2011

* cited by examiner

*Primary Examiner* — Hoa C Nguyen
(74) *Attorney, Agent, or Firm* — Rosenberg, Klein & Lee

(57) ABSTRACT

A multilayer stacked circuit arrangement with localized separation section, has a first flat cable and first signal transmission lines arranged on the first flat cable. A second flat cable is stacked on and bonded to the first flat cable. The second flat cable further has signal transmission lines arranged on it. A bonding substance layer is formed between a first non-separation section of the first flat cable and a second non-separation section of the second flat cable for properly stacking the first and second flat cables where the separation sections are spaced apart from each other. A conductive via extends between the first non-separation section and the second non-separation section. At least some of the second signal transmission lines of the second flat cable are connected through the conductive via to the first signal transmission lines of the first flat cable.

12 Claims, 3 Drawing Sheets

MULTILAYER STACKED CIRCUIT ARRANGEMENT WITH LOCALIZED SEPARATION SECTION

BACKGROUND OF THE INVENTION

1. Field of the Invention

The present invention relates to a multilayer stacked circuit arrangement, and in particular to a multilayer stacked circuit arrangement with localized separation section.

2. The Related Arts

Printed circuit boards and flexible flat cables are of individual advantages and characteristics. Different types of circuit board are used in different applications. The flexible flat cables are used in electronic products to serve as a component for signal connection at a foldable or rotatable structure and are nowadays most commonly used in a hinge part of an electronic product. The greatest value of output of the application of flexible flat cable in an electronic product is for clamshell, slip, flip, and three-dimensional rotation enclosure of electronic product.

For the currently-available products that include a flexible flat cable, the structure or arrangement of the flexible flat cable can be for example single-sided, double-sided, or multiple-layered, depending upon the needed number of transmission lines. A known structure of flexible flat cable comprises a plurality of insulation-jacketed conductors that juxtaposes each other in a side-by-side fashion to form a flat structure, which can be used to transmit signals between various electrical appliances, electronic devices, computer devices, and communication devices.

SUMMARY OF THE INVENTION

However, in practical applications of using a flat cable as a signal transmission line, although the flat cable can be easily put through and properly received in an elongate narrow space, yet the recently developed electronic devices or communication devices often include hinges of diverse structures. For example, a lot of widely used consumer electronics, including notebook computers, liquid crystal displays, digital cameras, mobile phones, touch panels, or the likes, adopt such a structure that a lid or a display screen is coupled through a hinge structure to a device body of electronic device. To transmit electrical signals from the device body of the electronic device to the lid or the display screen, the currently-adopted solution is that a miniaturized flat cable or a set of bundled tiny and thin conductor wires is used as a transmission line of signals. In such applications, a conventional flat cable may suffer many problems, such as undesired influence of the smoothness of rotation, insufficiency of flexibility, and insufficient robustness against cable flexing.

The present applicant has previously filed a patent application that teaches a flexible flat cable having a gap section. Such a flexible flat cable is provided for a single-layer flat cable by being used in combination with a cluster structure in order to overcome the problems of the conventional flexible flat cables and such a flexible flat cable meets the need of a major sector of the industry. However, such a flexible flat cable is still subject to constraints in respect of the structure. For example, development may still be made in connection with multilayer circuit boards, combinations of multiple single-sided circuit boards, or combinations of double-sided circuit boards and single-sided circuit boards. To cope with such a need, the present invention provides a multilayer stacked circuit arrangement with localized separation section to provide an additional option to the industry.

Thus, an objective of the present invention is to provide a multilayer stacked circuit arrangement with localized separation section, whereby the multilayer stacked circuit arrangement so made shows sufficient flexibility, has excellent robustness against cable flexing, and improves various drawbacks that occur in practical applications of the conventional flexible flat cables.

The technical solution that the present invention adopts to overcome such problems is arranging a bonding substance layer between a first non-separation section of a first flat cable and a second non-separation section of a second flat cable to have the first flat cable and the second flat cable stacked and properly positioned with respect to each other in such a way that a first separation section of the first flat cable is spaced from a second separation section of the second flat cable. At least one conductive via is formed and extends between the first non-separation section of the first flat cable and the second non-separation section of the second flat cable. At least some of second signal transmission lines of the second flat cable are connected through the conductive via to first signal transmission lines of the first flat cable.

In a preferred embodiment, the first flat cable and the second flat cable may either or both comprise at least one cluster section. Further, either or both of the first flat cable and the second flat cable may comprise a multilayer circuit board having inclusively three layers.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
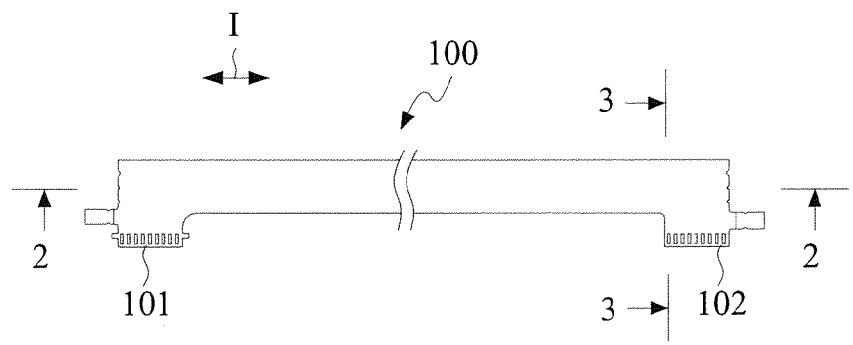
FIG. 1 is a schematic plan view showing a multilayer stacked circuit arrangement with localized separation section constructed in accordance with a first embodiment of the present invention.
Figure 2:
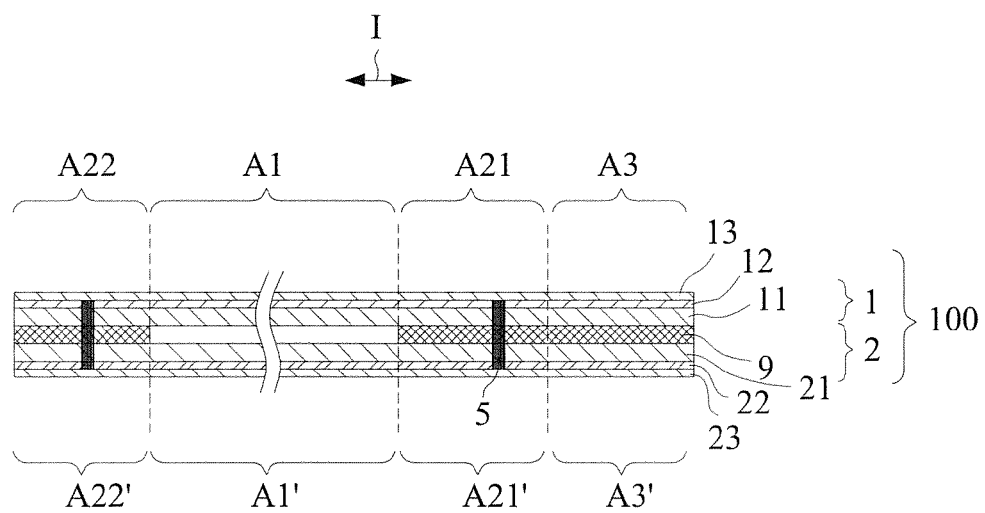
FIG. 2 is a cross-sectional view taken along line 2-2 of FIG. 1.

With reference to the drawings and in particular to FIG. 1, which is a schematic plan view showing a multilayer stacked circuit arrangement with localized separation section, generally designated at 100, according to a first embodiment of the present invention; FIG. 2, which is a cross-sectional view taken along line 2-2 of FIG. 1; and FIG. 3, which is a cross-sectional view taken along line 3-3 of FIG. 1, the multilayer stacked circuit arrangement 100 according to the present invention comprises generally a first flat cable 1, a second flat cable 2, and connection ends 101, 102 that are respectively formed at opposite ends of the multilayer stacked circuit arrangement 100. The connection ends 101, 102 can be for example a known gold-finger plugging structure or a component that comprises an insertion socket or a plugging member. The first flat cable 1 is of a configuration of regular flat cable extending in an extension direction I and comprising a first separation section A1, at least one first non-separation section A21, A22, and an extension section A3.

Figure 3:
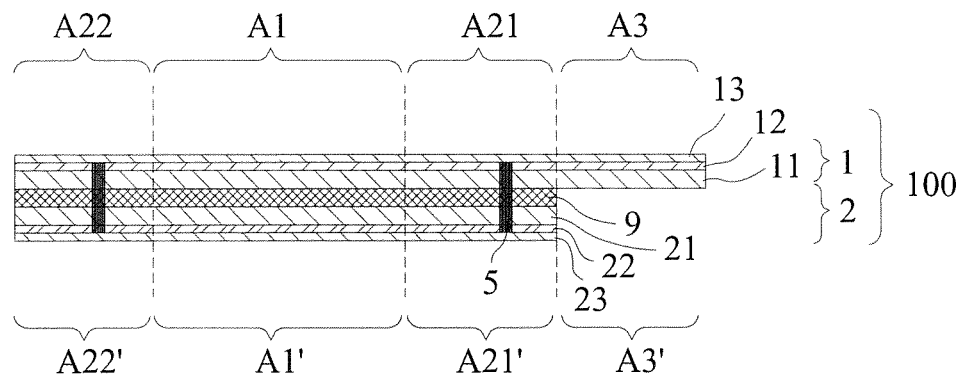
FIG. 3 is a cross-sectional view taken along line 3-3 of FIG. 1.
Figure 4:
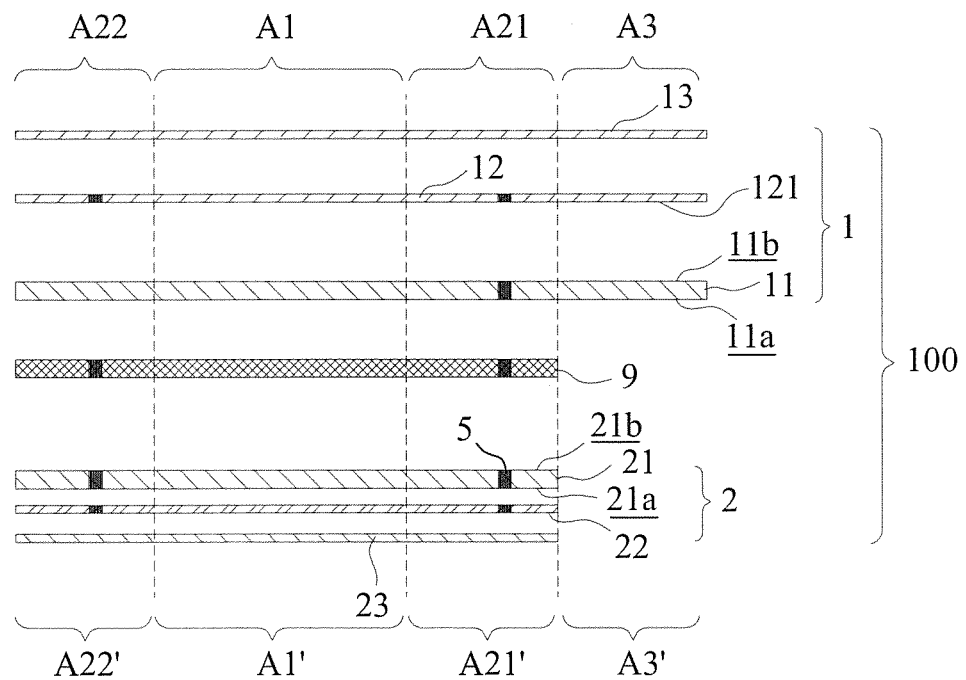
FIG. 4 is a cross-sectional view showing components included in FIG. 3 in a separated condition.

Also referring to FIGS. 3 and 4, in the embodiment illustrated, the first flat cable 1 comprises at least a substrate 11, which has a second surface 11$b$ on which a plurality of first signal transmission lines 12 is arranged, and a first insulation cover layer 13 covering the first signal transmission lines 12.

At least some of the first signal transmission lines 12 have an end extending to the extension section A3 of the first flat cable 1 and forming a plurality of mutually-isolated conductive terminals 121 that is spaced from each other by a predetermined distance. Depending upon applications, the extension section A3 of the first flat cable 1 can be structured as a plugging end or comprising a connector that has conductive pins connected to the conductive terminals 121.

The first flat cable 1 has a first surface 11$a$, on which at least one second flat cable 2 that extends in the extension direction I and forms a first separation section A1', at least one first non-separation section A21', A22', and an extension section A3' is stacked.

The second flat cable 2 comprises at least a substrate 21, which has a first surface 21$a$ on which a plurality of second signal transmission lines 22 is arranged, and a second insulation cover layer 23 covering a surface of the second signal transmission lines 22.

The first non-separation section A21, A22 of the first flat cable 1 is stacked, in a direction substantially perpendicular to the extension direction I, over the corresponding first non-separation section A21', A22' of the second flat cable 2. Between the first non-separation section A21, A22 of the first flat cable 1 and the first non-separation section A21', A22' of the second flat cable, a bonding substance layer 9 is formed to bond the first flat cable 1 and the second flat cable 2 together in a stacked and properly-positioned manner with the first separation section A1 of the first flat cable 1 being spaced from the first separation section A1' of the second flat cable 2. The bonding substance layer 9 can be for example a commonly used adhesive layer.

At least one conductive via 5 is formed and extends between the first non-separation section A21, A22 of the first flat cable 1 and the first non-separation section A21', A22' of the second flat cable 2. At least some of the second signal transmission lines 22 of the second flat cable 2 are connected through the conductive via 5 to at least some of the first signal transmission lines 12 of the first flat cable 1. In another embodiment of the present invention, the second signal transmission lines 22 may extend through the conductive via 5 to reach the first surface 11$a$ of the first flat cable 1 and are further extended to the first signal transmission lines 12 or predetermined ones of the conductive terminals 121 within the extension section A3 of the first flat cable 1.

In respect of the structures, the first flat cable 1 can be a circuit board comprising a single substrate, or a multilayer circuit board comprising a plurality of substrates (such as three or more than three layers). The second flat cable 2 can be a circuit board comprising a single substrate, or a multilayer circuit board comprising a plurality of substrates (such as three or more than three layers).

Figure 5:
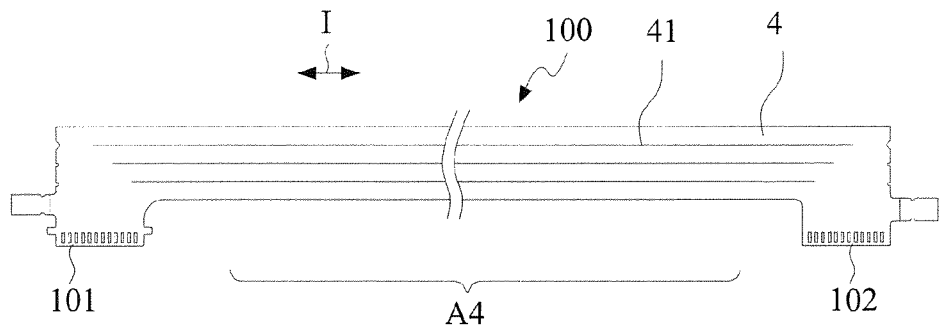
FIG. 5 is a schematic plan view illustrating a flat cable according to the present invention further comprising a cluster structure.

Referring to FIG. 5, the first flat cable 1 may further comprise at least one cluster structure A4 formed between the connection ends 101, 102. The cluster structure A4 is composed of a plurality of cluster lines 4 that is formed by slitting along a plurality of slit lines 41 extending in extension direction I of the first flat cable 1. Similarly, the second flat cable 2 may also comprise at least one cluster structure formed within the first separation section A1' of the second flat cable 2 and the cluster structure is composed of a plurality of cluster lines formed by slitting the second flat cable 2 in the extension direction I.

Alternatively or additionally, the cluster structure is formed within a second separation section of the second flat cable and the cluster structure is composed of a plurality of cluster lines formed by slitting the second flat cable in the extension direction.

Figure 6:
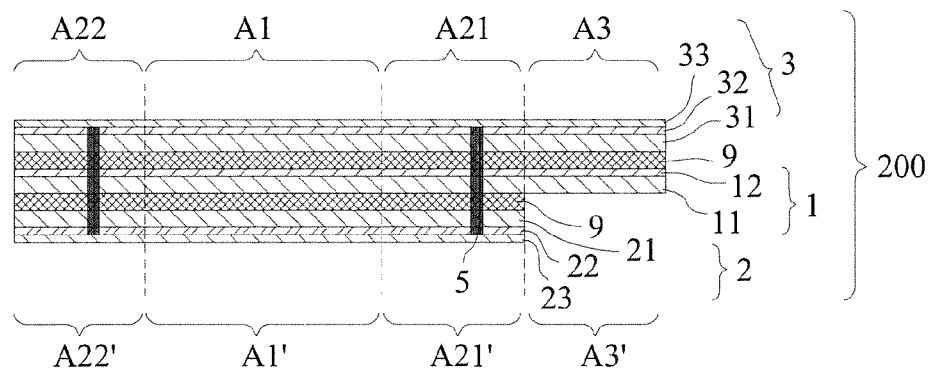
FIG. 6 is a cross-sectional view illustrating a multilayer stacked circuit arrangement with localized separation section constructed in accordance with a second embodiment of the present invention.

The previously described embodiment is given as an example comprising a single first flat cable 1 and a single second flat cable 2 for illustration. Alternatively, as shown in FIG. 6, which provides a multilayer stacked circuit arrangement 200 constructed in accordance with a second embodiment of the present invention, besides at least one second flat cable 2 being bonded to the first surface 11$a$ of the first flat cable 1, a third flat cable 3 is further provided to bond to the second surface 11$b$ of the first flat cable 1 through an additional bonding substance layer 9. The third flat cable 3 comprises constituent components including a substrate 31, third signal transmission lines 32, and a third insulation cover layer 33.

Figure 7:
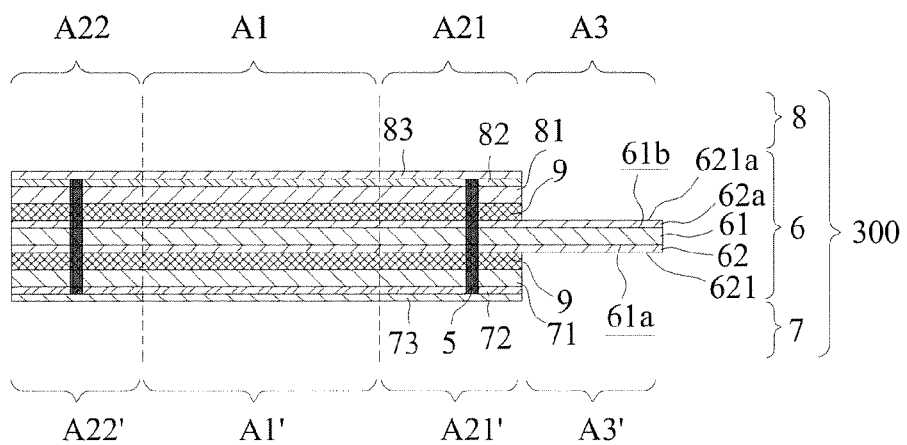
FIG. 7 is a cross-sectional view illustrating a multilayer stacked circuit arrangement with localized separation section constructed in accordance with a third embodiment of the present invention.

Besides being embodied as a single-sided board, the present invention may also be applicable to a double-sided board. As shown in FIG. 7, an example of four-layered board is given for illustration of a multilayer stacked circuit arrangement 300 according to a third embodiment of the present invention, which comprises a first flat cable 6 and at least one second flat cable 7. The first flat cable 6 is a double-sided flat cable, which is of a configuration of regular flat cable and forms a first separation section A1, a first non-separation section A21, A22, and an extension section A3.

The first flat cable 6 comprises a substrate 61, which has a first surface 61$a$ and a second surface 61$b$ on both of which a plurality of first signal transmission lines 62, 62$a$ is arranged.

At least some of the first signal transmission lines 62, 62$a$ have an end extending to the extension section (free end) of the first flat cable 6 and forming a plurality of mutually-isolated conductive terminals 621, 621$a$ that is spaced from each other by a predetermined distance.

At least one second flat cable 7 is stacked on and bonded to the first surface 61$a$ of the first flat cable 6 by a bonding substance layer 9. The second flat cable 7 comprises at least a substrate 71. The substrate 71 has a bottom surface on which a plurality of second signal transmission lines 72 is arranged and a second insulation cover layer 73 covers the second signal transmission lines 72.

At least one third flat cable 8 is stacked on and bonded to the second surface 61$b$ of the first flat cable 6 by a bonding substance layer 9. The third flat cable 8 comprises at least a substrate 81. The substrate 81 has a top surface on which a plurality of third signal transmission lines 82 is arranged, and a third insulation cover layer 83 covers the third signal transmission lines 82.

The stacked arrangement of the first flat cable 6, the second flat cable 7, and the third flat cable 8 is similar to what described with reference to the previous embodiment. The first non-separation section A21, A22 of the first flat cable 6 and first non-separation sections A21', A22' of the second flat cable 7 and the third flat cable 8 are bonded, stacked, and properly positioned through the bonding substance layers 9 in such a way that the first separation section A1 of the first flat cable 6 is spaced from the first separation sections A1' of the second flat cable 7 and the third flat cable 8.

At least one conductive via 5 is formed and extends between the first non-separation section A21, A22 of the first flat cable 6 and the first non-separation sections A21', A22' of the second flat cable 7 and the third flat cable 8. Thus, the first signal transmission lines 62, 62a, the second signal transmission lines 72, and the third signal transmission lines 82 of the first flat cable 6, the second flat cable 7, and the third flat cable 8 may be connected to, not connected to, or extended to predetermined ones of the conductive terminals 621 or 621a within the extension section A3 of the first flat cable 62 through the conductive via 5.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible multilayer stacked circuit arrangement, comprising:
    a first flat cable, which extends in an extension direction and forms at least one first separation section, at least one first non-separation section, and an extension section extending beyond the non-separation section in the extension direction, the at least one first non-separation section being formed between the separation section and the extension section;
    a plurality of conductive terminals, which is arranged in the extension section of the first flat cable;
    a plurality of first signal transmission lines, which is formed on the first flat cable;
    at least one second flat cable, which extends in the extension direction and forms at least one second separation section and at least one second non-separation section, the second separation section and the second non-separation section of the second flat cable being respectively stacked on the first separation section and the first non-separation section of the first flat cable in a direction substantially perpendicular to the extension direction;
    a bonding substance layer, which is formed between the first non-separation section of the first flat cable and the second non-separation section of the second flat cable to bond and position the first flat cable and the second flat cable in a stacked fashion in such a way that the first separation section of the first flat cable and the second separation section of the second flat cable are spaced from each other;
    a plurality of second signal transmission lines, which is formed on the second flat cable; and
    at least one conductive via, which extends between the first non-separation section of the first flat cable and the second non-separation section of the second flat cable, at least one of the second signal transmission lines of the second flat cable being connected through the conductive via to at least one of the first signal transmission lines of the first flat cable, wherein at least one of the flat cables include a cluster section, the cluster section including a plurality of alternating cluster lines and slit sections, the slit sections extending along the extension direction.

2. The multilayer stacked circuit arrangement as claimed in claim 1, wherein the first flat cable comprises a cluster section that is formed in the first separation section of the first flat cable, the cluster section comprising a plurality of alternating cluster lines and slit sections, the slit sections extending along the first flat cable in the extension direction.

3. The multilayer stacked circuit arrangement as claimed claim 1, wherein the second flat cable comprises a cluster section that is formed in the second separation section of the second flat cable, the cluster section comprising a plurality of alternating cluster lines and slit sections, the slit sections extending along the second flat cable in the extension direction.

4. The multilayer stacked circuit arrangement as claimed in claim 1, wherein the bonding substance layer comprises a layer of adhesive that adhesively bonds the first flat cable and the second flat cable in a stacked form.

5. The multilayer stacked circuit arrangement as claimed in claim 1, wherein the extension section of the first flat cable forms a plugging end or comprises a connector.

6. The multilayer stacked circuit arrangement as claimed in claim 1, wherein the first signal transmission lines are formed on one of a first surface and a second surface of the first flat cable.

7. The multilayer stacked circuit arrangement as claimed in claim 1, wherein the first signal transmission lines are formed on a first surface and a second surface of the first flat cable.

8. The multilayer stacked circuit arrangement as claimed in claim 1, wherein the second signal transmission lines are formed on one of a first surface and a second surface of the second flat cable.

9. The multilayer stacked circuit arrangement as claimed claim 1, wherein the second signal transmission lines are formed on a first surface and a second surface of the second flat cable.

10. The multilayer stacked circuit arrangement as claimed in claim 1, wherein the first flat cable comprises a multilayer circuit board having inclusively three layers.

11. The multilayer stacked circuit arrangement as claimed in claim 1, wherein the second flat cable comprises a multilayer circuit board having inclusively three layers.

12. A flexible multilayer stacked circuit arrangement, comprising:
    a first flat cable, which extends in an extension direction and forms at least one first separation section, at least one first non-separation section, and an extension section extending beyond the non-separation section in the extension direction, the at least one first non-separation section being formed between the separation section and the extension section;
    a plurality of conductive terminals arranged in the extension section of the first flat cable;
    a plurality of first signal transmission lines adjoined in side by side parallel relation formed on the first flat cable;
    at least one second flat cable, which extends in the extension direction and forms at least one second separation section and at least one second non-separation section, the second separation section and the second non-separation section of the second flat cable being respectively stacked on the first separation section and the first non-separation section of the first flat cable in a direction substantially perpendicular to the extension direction;
    a bonding substance layer, which is formed between the first non-separation section of the first flat cable and the second non-separation section of the second flat cable to flexibly bond the first flat cable and the second flat cable in a stacked fashion such that the first separation section of the first flat cable and the second separation section of the second flat cable are spaced from each other;
    a plurality of second signal transmission lines formed on the second flat cable; and at least one conductive via, which extends between the first non-separation section of the first flat cable and the second non-separation section of the second flat cable, at least one of the second signal transmission lines of the second flat cable being connected through the conductive via to at least one of the first signal transmission lines of the first flat cable, wherein the plurality of first signal transmission lines are separated by slits in the first separation section into sets of side by side signal transmission lines in parallel relation separated from adjacent sets.

* * * * *